United States Patent [19]

Dolby et al.

[11] Patent Number: 4,820,941
[45] Date of Patent: Apr. 11, 1989

[54] DECODER DRIVER CIRCUIT FOR PROGRAMMING HIGH-CAPACITANCE LINES

[75] Inventors: Debra J. Dolby, Missouri City; John F. Schreck; Phat Truong, both of Houston, all of Tex.

[73] Assignee: Texas Instruments Incorporated, Dallas, Tex.

[21] Appl. No.: 150,863

[22] Filed: Feb. 1, 1988

[51] Int. Cl.⁴ ............................................. H03K 17/10
[52] U.S. Cl. .................................. 307/449; 307/452; 307/475; 307/264; 365/226
[58] Field of Search ................. 307/449, 451, 452–453, 307/468–469, 475, 584, 585, 264, 272 R, 448, 443; 365/185, 226, 230

[56] References Cited

U.S. PATENT DOCUMENTS

| 4,441,172 | 4/1984 | Ebel | 365/226 |
|---|---|---|---|
| 4,442,481 | 4/1984 | Brahmbhatt | 307/449 X |
| 4,471,240 | 9/1984 | Novorel | 307/449 X |
| 4,565,932 | 1/1986 | Kuo et al. | 365/185 X |
| 4,574,273 | 3/1986 | Atsumi et al. | 307/451 X |
| 4,616,143 | 10/1986 | Miyamoto | 365/226 X |
| 4,651,029 | 3/1987 | Oritani | 307/449 |
| 4,692,638 | 9/1987 | Stiegler | 307/449 |
| 4,710,900 | 12/1987 | Higuchi | 365/185 X |
| 4,767,950 | 8/1988 | Schrenk | 365/226 X |

Primary Examiner—David Hudspeth
Attorney, Agent, or Firm—Theodore D. Lindgren

[57] ABSTRACT

A driver circuit for applying both read and program voltages to a wordline of an integrated-circuit memory-cell logic array. The driver circuit is comprised of a series driver transistor pair, of a driver enabling means for enabling and disenabling one of the transistors of the driver transistor pair, and of a latching means. The driver transistor used during read operation may be constructed with a relatively short source-drain channel, permitting faster access speed during read operation of the circuit.

13 Claims, 1 Drawing Sheet

DECODER DRIVER CIRCUIT FOR PROGRAMMING HIGH-CAPACITANCE LINES

BACKGROUND OF THE INVENTION

This invention relates to a circuit for driving a high-capacitance wordline of an integrated-circuit memory cell array in response to a voltage input from a decoder circuit.

Wordline driver circuits are used to apply voltages to the program/read gates of floating-gate transistors in integrated-circuit memory-cell arrays. When in the program mode, such drivers translate signals from integrated decoder circuits to signals which must be of sufficiently high voltage to charge the floating gates. When in the read mode, the driver circuits must provide a lower voltage signal having a risetime sufficiently rapid to charge the capacitance associated with and inherent in wordlines. The risetime must be sufficiently rapid to meet the operating speed requirements of the particular integrated circuit.

Construction, in integrated circuit form, of a driver circuit that is capable of furnishing the high voltage necessary for programming and that also provides a rapid response time during the read operation is difficult because driver transistors fabricated in integrated circuit form for high voltage use must have relatively long source-drain channels. The relatively long source-drain channels result in high capacitance characteristics that slow response time and decrease drive capability.

Accordingly, there is a need for an integrated-circuit wordline driver that is capable of providing high voltage signal output for programming floating gate transistors and that is capable of providing a low voltage output signals with rapid response times during read operation.

SUMMARY OF THE INVENTION

This invention provides a wordline driver circuit in integrated-circuit form that is capable of providng both high and low voltage outputs for programming and for reading, respectively, and that has the low internal capacitance and has the increased external drive capability necessary to provide rapid charging of the capacitance of wordlines attached thereto.

The disclosed circuit is comprised of a series driver transistor pair, of a driver enabling means for enabling and disenabling one of the transistors of the driver transistor pair, and of a latching circuit means. By having capability for disenabling and isolating one of the transistors of the driver transistor pair, the disclosed circuit configuration permits the drive transistor used for read operation to be be fabricated using short-channel complementary metal-oxide-semiconductor (CMOS construction procedures because the maximum source-drain voltage of that transistor, which occurs when the transistor is nonconductive, is less than the gate-charging voltage. Therefore, the rapid response time of the disclosed driver circuit permits faster operating speed during reading of the programmed status of the integrated circuit logic array.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE EMBODIMENTS

Figure 1:
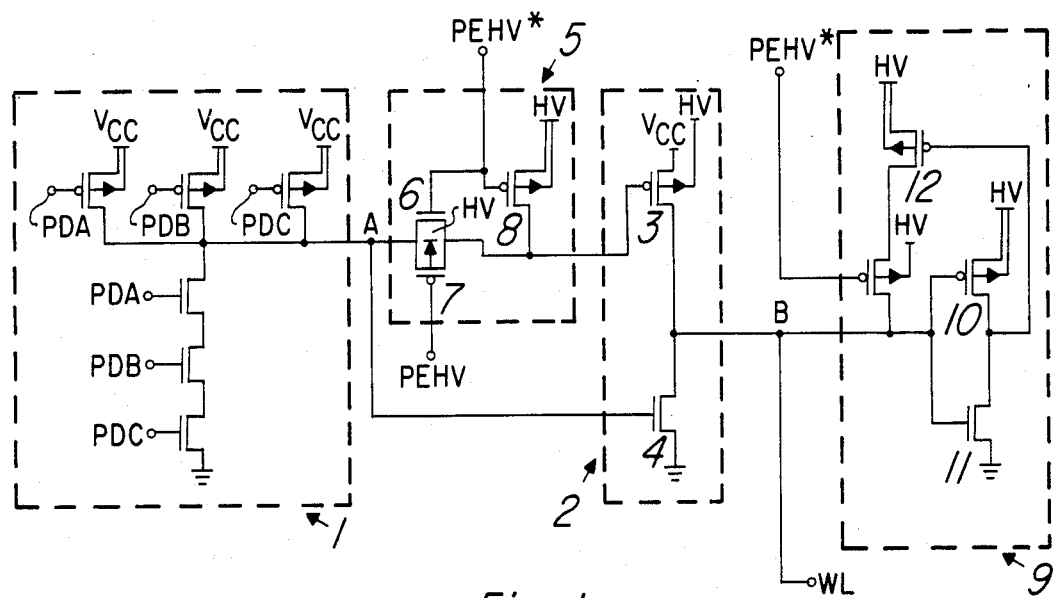
FIG. 1 is a circuit diagram of the decoder driver circuit of this invention, illustrating its use with a decoder circuit and a wordline of an integrated circuit logic array.
Figure 2:
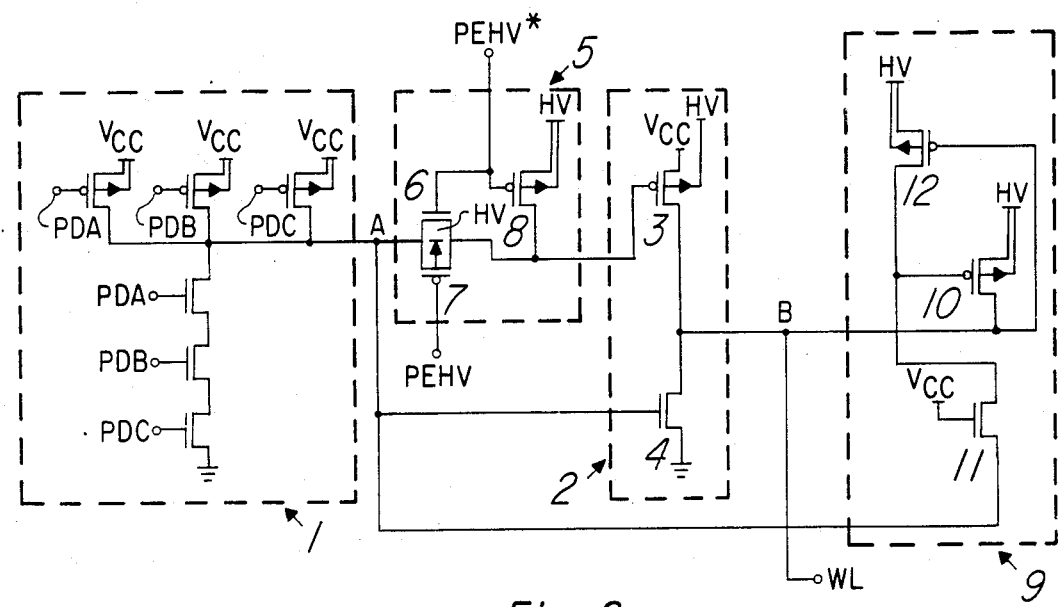
FIG. 2 is an alternative embodiment of the invention, indicating an alternative latching circuit means for use with the driver circuit of this invention.

Referring to FIGS. 1 and 2, logic or decoder circuit 1 is comprised of the usual series and parallel connection of transistors used for programming floating gates and for reading status of programmed gates. The supply voltage Vcc for logic circuit 1 is used both for programming and reading and is typically five volts. The N-tanks of the P-channel parallel-connected transistors of logic or decoder circuit 1 are biased at the supply voltage potential Vcc. The output at terminal A of logic circuit 1 is either equivalent to operating supply voltage Vcc or is equivalent to a reference potential indicated by the ground symbol, depending on the status of the input to gates PDA–PDC of the transistors comprising logic or decoder circuit 1.

Driver transistor pair 2 is comprised of series driver transistors 3 and 4 which have source-drain paths connected in series between the operating supply voltage Vcc and the source of reference potential. Transistor 3, which is connected nearest the operating supply voltage source Vcc, is illustrated as a P-channel transistor with N-tank biased at the floating-gate-charging source potential HV, typically greater than twelve volts. The voltage HV is equal to the operating supply voltage Vcc during read operations. Transistor 4, which is connected nearest the source of reference potential or ground, is illustrated as a N-channel transistor. The output terminal B of driver pair 2 is the common terminal of the series driver transistor connection and is connected to a wordline WL of a floating-gate metal-oxide-semiconductor logic array. The gate of transistor 4 is connected directly to the output terminal A of logic circuit 1. The gate of transistor 3 is connected to the output terminal A of logic circuit 1 when enabling circuit means 5 is in one of its two states. Transistor 3 may be constructed with a short source-drain channel because the maximum source-drain voltage of transistor 3 occurs when the transistor in nonconductive and is no greater than the difference between the programming voltage HV and the supply voltage Vcc, which is typically between seven and eight volts.

Driver enabling means 5 is comprised in part of N-channel transistor 6 and of P-channel transistor 7, both of which have source-drain paths connected between the output terminal A of logic circuit 1 and the gate of driver transistor 3. The N-tank of P-channel transistor 7 is biased at the potential of the gate-charging source HV. Driver enabling means 5 also includes P-type transistor 8 with source-drain path connected between source HV and the gate of driver transistor 3 and with N-tank biased at potential HV. The gates of enabling transistors 6 and 8 are connected to a complementary enabling signal source PEHV* that is at reference potential or ground during programming operation and is at potential HV during read operation. The gate of enabling transistor 7 is connected to enabling signal source PEHV that is at potential HV during programming operation and is at reference potential during read operation.

Referring to FIG. 1, latching circuit 9 is comprised in part of transistors 10 and 11 with source-drain paths connected in series between programming source HV and reference potential. Latching transistor 10, which is connected nearest source HV, has a P-type channel with a N-type tank biased at potential HV. Latching transistor 11, which is connected nearest reference potential, has a N-type channel. The gates of transistors 10 and 11 are connected to the output terminal B of driver circuit 2. Latching circuit 9 is also comprised of P-channel transistor 12 With N-tank biased at potential HV and with source-drain path connected between source HV and the output of driver circuit 2 through optional enabling transistor 13. The gate of transistor 12 is connected to the common source-drain terminal of latching transistors 10 and 11. Optional P-type transistor 13 has a N-tank biased at potential HV and has its source-drain path connected between the source-drain path of transistor 12 and the output terminal B of driver circuit 2. The gate of optional enabling transistor 13 is connected to complementary enabling signal PEHV*.

Referring to FIG. 2, latching circuit 9 is comprised in part of transistors 11 and 12 with source-drain paths connected in series between programming source HV and output terminal A of logic circuit 1. Latching transistor 12, which is connected nearest source HV, has a P-type channel with N-tank biased at potential HV. Transistor 11, which is connected nearest terminal A, has a N-type channel. The gate of transistor 12 is connected to output terminal B of driver circuit 2 and the gate of transistor 11 is connected to supply voltage Vcc. Latching circuit 9 is also comprised of P-channel latching transistor 10 with N-tank biased at potential HV and with source-drain path connected between potential HV and output terminal B of driver circuit 2. The gate of latching transistor 10 is connected to the common source-drain terminal of transistors 11 and 12.

During read operation of the circuit of FIG. 1, low voltage signal PEHV and high voltage signal PEHV* cause transistors 6 and 7 to become conductive and cause transistor 8 to become nonconductive, thereby connecting the gate of driver transistor 3 to terminal A. Latching circuit 9 may be disabled by high voltage signal PEHV*, which causes optional enabling transistor 13 to become nonconductive.

During read operation of the circuit of FIG. 1, the wordline WL is either at reference potential or at source voltage Vcc (which HV equals during read operation) potential, depending on whether the input signal at terminal A of decoder circuit 1 is at the inverse of those potentials. A supply voltage Vcc input at terminal A during read operation will result in a zero or reference level voltage at wordline WL by biasing the gates of transistors 3 and 4 such that driver transistor 4 becomes conductive and driver transistor 3 becomes nonconductive. Conductive transistor 4 biases the gates of transistors 10 and 11 such that transistor 10 is conductive and transistor 11 is nonconductive. Conductive transistor 10 biases the gate of transistor 12 at HV potential, causing transistor 12 to be nonconductive. Therefore, whether or not latching circuit 9 is disabled by optional transistor 13, wordline WL is tied to reference potential through driver transistor 4. A zero or reference level voltage signal at input terminal A during read operation will result in a voltage level Vcc at wordline WL by biasing gates to cause driver transistor 3 to become conductive and to cause driver transistor 4 to become nonconductive. Conductive transistor 3 biases the gates of transistors 10 and 11 such that transistor 10 is nonconductive and transistor 11 is conductive. Conductive transistor 11 biases the gate of transistor 12 at reference potential, causing transistor 12 to become conductive. Wordline WL is tied to Vcc through driver transistor 3 and, if optional transistor 13 is not used, is also biased at Vcc through transistor 12 because the HV potential is equal to Vcc during read operations.

During programing or write operation of the circuit of FIG. 1, high voltage signal PEHV and low voltage signal PEHV* cause transistors 6 and 7 to become nonconductive and cause transistor 8 to become conductive, thereby biasing the gate of driver transistor 3 such the transistor 3 becomes nonconductive. Optional enabling transistor 13, if used, is caused to become conductive by low voltage signal PEHV*.

During programming operation of the circuit of FIG. 1, the wordline is at reference potential when the output of decoder circuit 1 at terminal A is at supply votage potential Vcc and is at programming source potential HV when the output of decoder circuit 1 at terminal A is at zero or reference potential. A supply voltage potential Vcc at terminal A will cause a zero or reference voltage at wordline WL by biasing the gate of driver transistor 4 such that transistor 4 becomes conductive. Driver transistor 3 remains nonconductive because of the gate voltage HV conducted through enabling transistor 8. Therefore, wordline WL is tied to reference potential though driver transistor 4. With wordline WL tied to reference potential, latching circuit 9 is characterized by nonconductive transistors 11 and 12 and conductive transistor 10. During actual programming or charging of a floating gate, a zero or reference potential at terminal A will cause a potential HV which is equal to Vcc at wordline WL by biasing the gate of driver transistor 4 such that transistor 4 becomes nonconductive. With wordline WL at potential HV, which then increases to from typically five volts to typically greater than twelve volts to charge the floating gate, the state of latching circuit 9 is that transistors 11 and 12 are conductive and transistor 10 is nonconductive. Transistor 11 ties the gate of transistor 12 to reference potential, thereby latching transistor 12 in the conductive state. Wordline WL is tied to progamming potential HV through transistor 12 and optional transistor 13, the latter of which is held in conductive state by complementary enabling signal PEHV*.

Read and write operation of the circuit of FIG. 2 is similar to that of FIG. 1 with the exception that transistors 10 and 11 are nonconductive and transistor 12 is conductive for wordline status "0" and are those transistors are of opposite conductivity state for wordline WL status "1". Transistor 11 acts as an isolation transistor for isolating potential HV. That is, when transistor 12 is in a conductive state and the voltage at terminal A is equal to Vcc, transistor 12 performs in a manner similar to a reverse biased diode. When the voltage at terminal A is at zero or reference voltage, transistor 12 acts as a conducting transistor. Therefore, transistor 12 removes the requirement of the circuit of FIG. 2 in which the wordline must be in a certain state prior to increasing the programming voltage from typically five volts to typically greater than twelve volts. While the invention has been described with reference to an illustrative embodiment, the description is not to be construed in a limiting sense. Various modifications of the illustrative embodiments of the invention will be apparent to those of skill in the art and it is contemplated that the appended claims will cover any such modifications that fall within the scope of the invention.

What is claimed is:

1. A decoder driver circuit for reading and programming integrated-circuit logic arrays comprising:
   a driver transistor pair with transistor source-drain paths connected in series between a supply voltage source and a reference potential,
   a driver enabling means for enabling and disenabling one transistor of said driver transistor pair, and
   a latching circuit means connected to a programming voltage source,
   wherein the gate of said one transistor of said driver transistor pair is connected to the output of a decoder circuit through said driver enabling means,
   wherein the gate of the other transistor of said driver transistor pair is connected to said output of said decoder circuit,
   wherein said driver enabling means is connected to a source of enabling signals, and
   wherein the output terminal of said driver transistor pair is connected to said latching circuit means and to the wordline of an integrated-circuit logic array.

2. The decoder driver circuit of claim 1 in which said one transistor of said driver pair is comprised of a P-channel transistor and said other transistor is comprised of a N-channel transistor.

3. The decoder driver circuit of claim 2 in which the source-drain path of said one transistor of said driver pair is relatively short in comparison with the source-drain path of an equivalent transistor designed to withstand a source-drain potential equal to the maximum voltage of the programming voltage source.

4. The decoder driver circuit of claim 1 in which said enabling means is comprised of a number of transistors for connecting the gate of said one transistor to one of said voltage sources when applying programming voltages to said wordline and for connecting said gate of said one transistor to said decoder circuit when applying read voltages to said wordline.

5. The decoder circuit of claim 4 in which said enabling means is comprised of at least a N-channel transistor with source-drain path connected between said gate of said one transistor and said output of said decoder circuit and is comprised of a P-channel transistor connected between said voltage source and said gate of said one transistor.

6. The decoder circuit of claim 1 in which said latching circuit means is comprised of a P-channel latching transistor and of a N-channel latching transistor with source-drain paths connected in series between said programming voltage source and said reference potential and with the gates connected to said wordline, and is further comprised of a second P-channel transistor with source-drain path connected between said programming voltage source and said wordline and with gate connected to the common terminal of said series latching transistors, wherein the voltage of said programming voltage source is equal to the voltage of said supply voltage source during read operation of said decoder driver circuit.

7. The decoder driver circuit of claim 6 in which said latching circuit means is further comprised of a P-channel enabling transistor with source drain path connected between said second P-channel transistor and said wordline and with gate connected to said source of enabling signals.

8. The decoder driver circuit of claim 1 in which said latching circuit means is comprised of a P-channel latching transistor and a N-channel transistor with source-drain paths connected in series between said programming voltage source and said output of said decoder circuit and with gates connected to said wordline and to said supply voltage source, respectively, and is further comprised of a P-channel latching transistor with source-drain path connected between said programming voltage source and said wordline and with gate connected to the common terminal of said series P-channel and N-channel transistors, wherein the voltage of said programming voltage source is equal to the voltage of said supply voltage during read operation of said decoder driver circuit.

9. An integrated-circuit, memory-cell wordline-driver circuit comprising:
   a driver transistor pair with source-drain paths connected in series between a supply voltage source and a reference potential source, with common terminal connected to the wordline of a memory cell array, and with the gate of a first transistor of said pair nearest said reference potential connected to the output of a decoder circuit;
   a driver enabling circuit connected to a programming source voltage, to enabling signals, to said output of said decoder circuit, and to the gate of the second transistor of said pair nearest said supply voltage source; and
   a latching circuit connected to said programming voltage source and to said wordline.

10. The wordline-driver circuit of claim 9 in which said first transistor of said driver transistor pair is a P-channel transistor with dimensions shorter than the dimensions of an equivalent P-channel transistor designed to withstand a source-drain potential equal to the maximum voltage of the programming voltage source.

11. The wordline-driver circuit of claim 1? in which said second transistor of said driver transistor pair is a N-channel transistor.

12. The wordline-driver circuit of claim 11 in which said driver enabling circuit is further comprised of at least a N-channel transistor with source-drain path connected between said gate of said first transistor and said output of said decoder circuit and is further comprised of a P-channel transistor connected between said programming voltage source and said gate of said first transistor.

13. The wordline-driver circuit of claim 9 in which said latching circuit is further comprised of a P-channel latching transistor and a N-channel transistor with source-drain paths connected in series between said programming voltage source and said output of said decoder circuit and with gates connected to said wordline and to said supply voltage source, respectively, and is further comprised of a P-channel latching transistor with source-drain path connected between said programming voltage source and said wordline and with gate connected to the common terminal of said series P-channel and N-channel transistors, wherein the voltage of said programming voltage source is equal to the voltage of said supply voltage during read operation of said driver circuit.

* * * * *